US007818158B2

(12) United States Patent
McDonald et al.

(10) Patent No.: US 7,818,158 B2
(45) Date of Patent: Oct. 19, 2010

(54) METHOD FOR SYMBOLIC SIMULATION OF CIRCUITS HAVING NON-DIGITAL NODE VOLTAGES

(75) Inventors: Clayton B. McDonald, Chapel Hill, NC (US); Hsinwei Chou, Sunnyvale, CA (US); Smriti Gupta, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 1153 days.

(21) Appl. No.: 11/233,323

(22) Filed: Sep. 21, 2005

(65) Prior Publication Data

US 2007/0078638 A1    Apr. 5, 2007

(51) Int. Cl.
G06F 17/50    (2006.01)
G06G 7/48    (2006.01)
(52) U.S. Cl. ............................................ 703/14; 703/3
(58) Field of Classification Search .................... 703/19, 703/14, 3
See application file for complete search history.

(56) References Cited

U.S. PATENT DOCUMENTS

| 5,264,785 | A | * | 11/1993 | Greason | 323/350 |
|---|---|---|---|---|---|
| 5,313,398 | A | * | 5/1994 | Rohrer et al. | 703/14 |
| 5,373,457 | A | * | 12/1994 | George et al. | 703/2 |
| 5,553,008 | A | * | 9/1996 | Huang et al. | 703/14 |
| 5,675,502 | A | * | 10/1997 | Cox | 716/6 |
| 5,686,863 | A | * | 11/1997 | Whiteside | 330/260 |
| 5,687,355 | A | * | 11/1997 | Joardar et al. | 716/20 |
| 5,692,158 | A | * | 11/1997 | Degeneff et al. | 703/2 |
| 5,999,718 | A | * | 12/1999 | Wang et al. | 703/2 |
| 6,134,513 | A | * | 10/2000 | Gopal | 703/14 |
| 6,190,433 | B1 | * | 2/2001 | Van Fleet et al. | 71/18 |
| 6,269,277 | B1 | * | 7/2001 | Hershenson et al. | 700/97 |
| 6,459,324 | B1 | * | 10/2002 | Neacsu et al. | 327/379 |
| 6,577,992 | B1 | * | 6/2003 | Tcherniaev et al. | 703/14 |
| 6,634,012 | B2 | | 10/2003 | Zhong et al. | 716/5 |
| 6,662,149 | B1 | * | 12/2003 | Devgan et al. | 703/14 |
| 6,807,520 | B1 | * | 10/2004 | Zhou et al. | 703/14 |
| 7,006,961 | B2 | * | 2/2006 | Mandell et al. | 703/14 |
| 7,013,253 | B1 | * | 3/2006 | Cong et al. | 703/14 |
| 7,049,875 | B2 | * | 5/2006 | Tsividis | 327/308 |
| 7,143,021 | B1 | * | 11/2006 | McGaughy et al. | 703/14 |

(Continued)

OTHER PUBLICATIONS

Understanding Semiconductor Devices by Sima Dimitrijev ISBN 0-19-513186-X Publication year 2000 p. 4-5.*

(Continued)

*Primary Examiner*—Kamini S Shah
*Assistant Examiner*—Akesh Saxena
(74) *Attorney, Agent, or Firm*—Silicon Valley Patent Group LLP; Omkar Suryadevara

(57) ABSTRACT

In a computer simulation of an analog device in a digital circuit, a piece-wise linear lookup table is used to determine the channel resistance of the transistors in the analog device, allowing the node voltages to take on non-digital values. The piece-wise linear lookup table contains a set of channel resistances corresponding respectively to gate-to-source voltages. The program uses multi-terminal binary decision graphs (MTBDDs) to represent non-digital resistances, capacitances and voltages in the circuit as a function of symbolic inputs. The program can analyze circuits containing more than two voltage sources by modeling voltage sources with voltage dividers between the maximum and minimum voltages in the circuit.

28 Claims, 14 Drawing Sheets

U.S. PATENT DOCUMENTS

| | | | | |
|---|---|---|---|---|
| 7,353,157 | B2* | 4/2008 | Wasynczuk et al. | 703/14 |
| 2001/0029601 | A1* | 10/2001 | Kimura et al. | 716/19 |
| 2002/0016704 | A1* | 2/2002 | Blanks | 703/14 |
| 2003/0120473 | A1* | 6/2003 | Jain et al. | 703/14 |
| 2003/0208347 | A1* | 11/2003 | Huang | 703/14 |
| 2004/0049370 | A1* | 3/2004 | Stanley et al. | 703/14 |
| 2004/0117162 | A1* | 6/2004 | Ozis et al. | 703/2 |
| 2004/0148150 | A1* | 7/2004 | Ashar et al. | 703/14 |
| 2005/0027491 | A1* | 2/2005 | Fertner et al. | 702/196 |
| 2005/0143966 | A1* | 6/2005 | McGaughy | 703/3 |
| 2005/0149311 | A1* | 7/2005 | McGaughy | 703/14 |
| 2005/0149312 | A1* | 7/2005 | McGaughy | 703/14 |
| 2005/0257178 | A1* | 11/2005 | Daems et al. | 716/2 |
| 2005/0273307 | A1* | 12/2005 | Hemmett | 703/14 |
| 2006/0069537 | A1* | 3/2006 | Cao | 703/14 |
| 2007/0261015 | A1* | 11/2007 | Morgenshtein et al. | 716/1 |
| 2008/0033708 | A1* | 2/2008 | Kanapka et al. | 703/14 |

OTHER PUBLICATIONS

An amorphous-silicon thin-film transistor model including variable resistance effect by Tanizawa, M.; Kikuta, S.; Nakagawa, N.; Ishikawa, K.; Kotani, N.; Miyoshi, H.;Simulation of Semiconductor Processes and Devices, 1996. SISPAD 96. 1996 International Conference onSep. 2-4, 1996 pp. 181-182.*

Computing Logic-Stage Delays Using Circuit Simulation and Symbolic Elmore Analysis by Clayton B. McDonald Randal E. Bryant; IEEE 2001 p. 283-288.*

TETA: Transistor-Level Engine for Timing Analysis by F. Dartu and L. T. Pileggi. Proceedings of the Design Automation by Conference, pp. 595-598, Jun. 1998.*

Microelectronic Circuits- Fourth Edition ; Sedra and Smith Jan. 1998; ISBN 0-19-511663-1; p. 366-369 and book cover.*

Bahar, R. I. et al. "Algebraic Decision Diagrams And Their Applications", ACM/IEEE International Conference on Computer Aided Design, Nov. 1993, pp. 4.

Somenzi, F. "CUDD: CU Decision Diagram Package—Release 2.2. 0", May 12, 1998, pp. 47.

Bryant, R. E. "Graph-Based Algorithms For Boolean Function Manipulation", IEEE Transactions on Computers, vol. C-35, No. 8, Aug. 1986, pp. 25.

Andersen, H. R. et al. "Boolean Expression Diagrams", In LICS, 1997, pp. 21.

Kuehlmann, A. et al. "Equivalence Checking Using Cuts And Heaps", Proceedings of the Design Automation Conference (DAC'97), Anaheim, CA, Jun. 1997, pp. 6.

Bryant, R. E. et al. "Verification Of Arithmetic Circuits Using Binary Moment Diagrams", Software Tools for Technology Transfer, Springer-Verlag, vol. 3, No. 2, May 2001, pp. 18.

Chen, Y.-A. et al. "PHDD: An Efficient Graph Representation For Floating Point Circuit Verification", International Conference on Computer-Aided Design (ICCAD'97), Nov. 1997, pp. 6.

PhD Thesis titled "Symbolic Functional and Timing Verification of Transistor Level Circuits," Clayton B. McDonald, Apr. 9, 2001, Carnegie-Mellon University, 91 pages.

* cited by examiner

CCR

| Name | G1 | G2 | G3 |
|---|---|---|---|
| List of Nodes | H1 | H2 | H3 |
| Maximum Voltage | I1 | I2 | I3 |
| Minimum Voltage | J1 | J2 | J3 |

— 354

Transistor List
(for each CCR)

| Gate Node | K1 | K2 | K3 |
|---|---|---|---|
| Source Node | L1 | L2 | L3 |
| Drain Node | M1 | M2 | M3 |
| P/W/L Lookup Table | N1 | N2 | N3 |
| Channel Width | O1 | O2 | O3 |
| Channel Length | P1 | P2 | P3 |
| Type (N or P) | Q1 | Q2 | Q3 |

METHOD FOR SYMBOLIC SIMULATION OF CIRCUITS HAVING NON-DIGITAL NODE VOLTAGES

FIELD OF THE INVENTION

This invention pertains to methods of simulating the performance of electrical circuits and in particular to methods of simulating circuits that contain analog circuits or devices.

BACKGROUND

Symbolic simulation is a well-known technology for the functional verification of digital circuits. Symbolic simulation differs from conventional simulation in that in conventional simulation programs both the inputs and outputs are actual binary values (1s and 0s)), whereas in symbolic simulation programs the inputs are symbols representing both 0 and 1 (e.g., $a_1, a_2, a_3, a_4, \ldots b_1, b_2, b_3, b_4$, etc.) and the outputs are Boolean expressions. Typically the clock remains binary. The circuit is verified by checking the output Boolean expressions against a reference.

Some primarily digital circuits contain analog devices and hence have non-digital node voltages. The presence of analog devices in the circuit impacts the functionality being verified. For example, in normal digital simulation programs the output of the Schmitt trigger shown in FIG. 1 can only take on digital values, which means that the feedback transistors 10 and 12 appear to be either on or off. If transistors 10 and 12 are sized such that they are stronger than the other transistors in the device, then the current state of the output node will be permanently locked. In reality, however, when the input node switches from 1 to 0 or vice-versa, the voltage at the output node will shift slightly. This sets up a positive feedback condition that will end up with the output node completely shifted. This result can be accounted for, however, only if the voltage at the output node is capable of taking on non-digital voltages.

Similarly, with the sense-amplifier shown in FIG. 2, when the enable signal goes high, the voltages at "ti" and "tf" are isolated from the voltages at "t" and "f", respectively, setting up a positive feedback condition that will result in the higher of "ti" and "tf" being pulled up to the supply voltage and the lower of "ti" and "tf" being pulled down to ground. In a digital simulation scheme, the node values can only be 1 or 0. Therefore, if t=1.5V and f=1.2V, both nodes will be represented as logical 1s. When the enable signal goes high an oscillation will be set up that will never resolve itself.

One way of dealing with this problem is to manually replace the analog devices in the circuit with digital models before verification. This process is time consuming and error prone, however, and therefore makes the accuracy of the results questionable.

Another technique for analyzing analog devices in digital circuits involves symbolic analysis in Mathematica™, using algebraic expressions that fully describe the behavior of the circuit. This is very slow, however, and is applicable only to very small circuits. Model-checking on extracted flow-graphs is similarly a very slow, manual effort. Use of SPICE or fast-Spice (Nanosim™, Hsim™, etc,) requires exhaustive test benches; the size of test bench increases exponentially with the size of the circuit being analyzed.

Accordingly, there is a clear need for a fast, efficient and accurate way of symbolically simulating and verifying digital circuits that contain analog components.

SUMMARY

The method of this invention is performed in a computer. In the method of this invention, the transistors within an analog circuit are modeled as variable resistors. For each transistor, the program applies the gate-to-source voltage (Vgs) to a piece-wise linear lookup table to determine the channel resistance of the transistor. The piece-wise linear lookup table expresses the channel resistance of the transistor as a function of its Vgs, its on-resistance, its size and other factors specific to the transistor.

Advantageously, both Vgs and the resistance of the transistor are expressed as Multi-Terminal Binary Decision Diagrams (MTBDDs, also known in the literature as Algebraic Decision Diagrams, or ADDs), which are a convenient mechanism for expressing a plurality of non-digital (real-valued) outputs as a Boolean function of a discrete number of digital inputs. Similarly, the node voltages and capacitances in the analog circuit may generally be expressed as MTBDDs.

Using a piece-wise linear lookup table to determine the resistance of each transistor, the pull-up resistance between the node and the high supply voltage and the pull-down resistance between the node and the low voltage supply are computed. After the pull-up and pull-down resistances have been calculated, a voltage divider formula is used to compute the voltage at the node. The time at which the voltage will occur at the node (i.e., the delay) is then computed, using the effective capacitance of the node, and the node voltage and delay are entered chronologically in an event queue. After a change in the inputs of the circuit, the program repeatedly returns to analyze the next event in the event queue until the queue is empty, indicating that the circuit has reached a steady-state condition. The steady-state condition lasts until there is another change at the inputs.

According to an aspect of the invention, circuits that have more that two voltage sources can be analyzed. To do this, the computer program identifies the maximum and minimum voltage sources. All other voltage sources are mimicked by creating voltage dividers between the maximum and minimum supply voltages. Preferably, the resistors in each voltage divider are small in relation to the other resistances in the circuit.

Moreover, the computer program of this invention is able to handle unknown input values by allowing node voltages and transistor resistances to be min-max ranges.

Using the computer program of this invention makes it possible to simulate and verify digital circuits containing analog devices accurately and efficiently.

BRIEF DESCRIPTION OF THE DRAWINGS

FIGS. 3C and 3D illustrate a schematic diagram of the memory of the computer shown in FIG. 3B.

DETAILED DESCRIPTION

Figure 1:
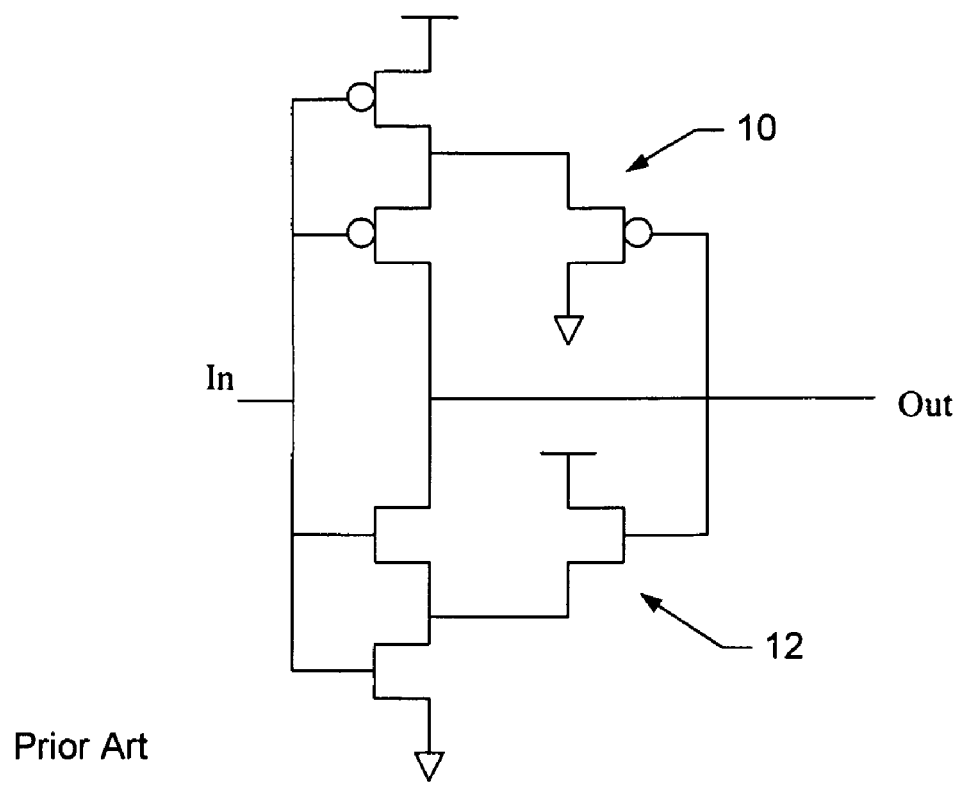
FIG. 1 is a schematic circuit diagram of a Schmitt trigger.
Figure 2:
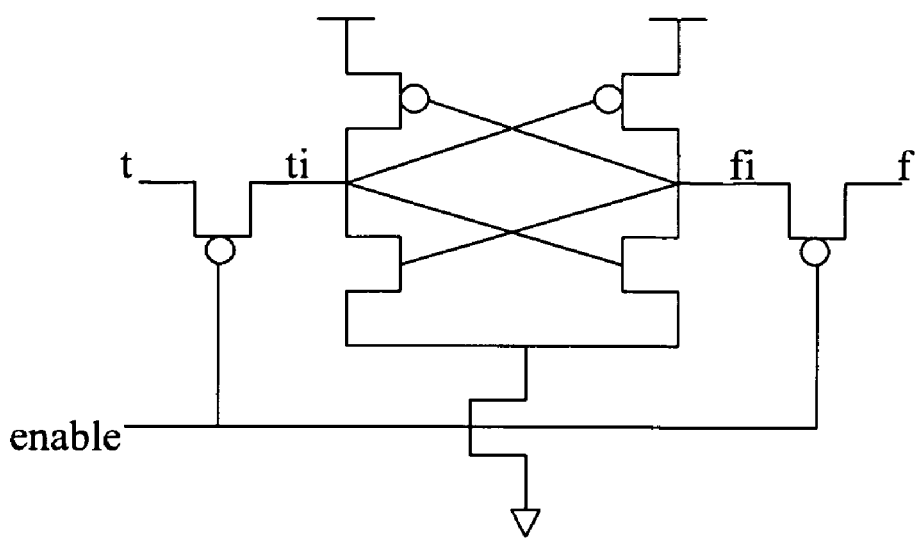
FIG. 2 is a schematic circuit diagram of a sense-amplifier.
Figure 3A:
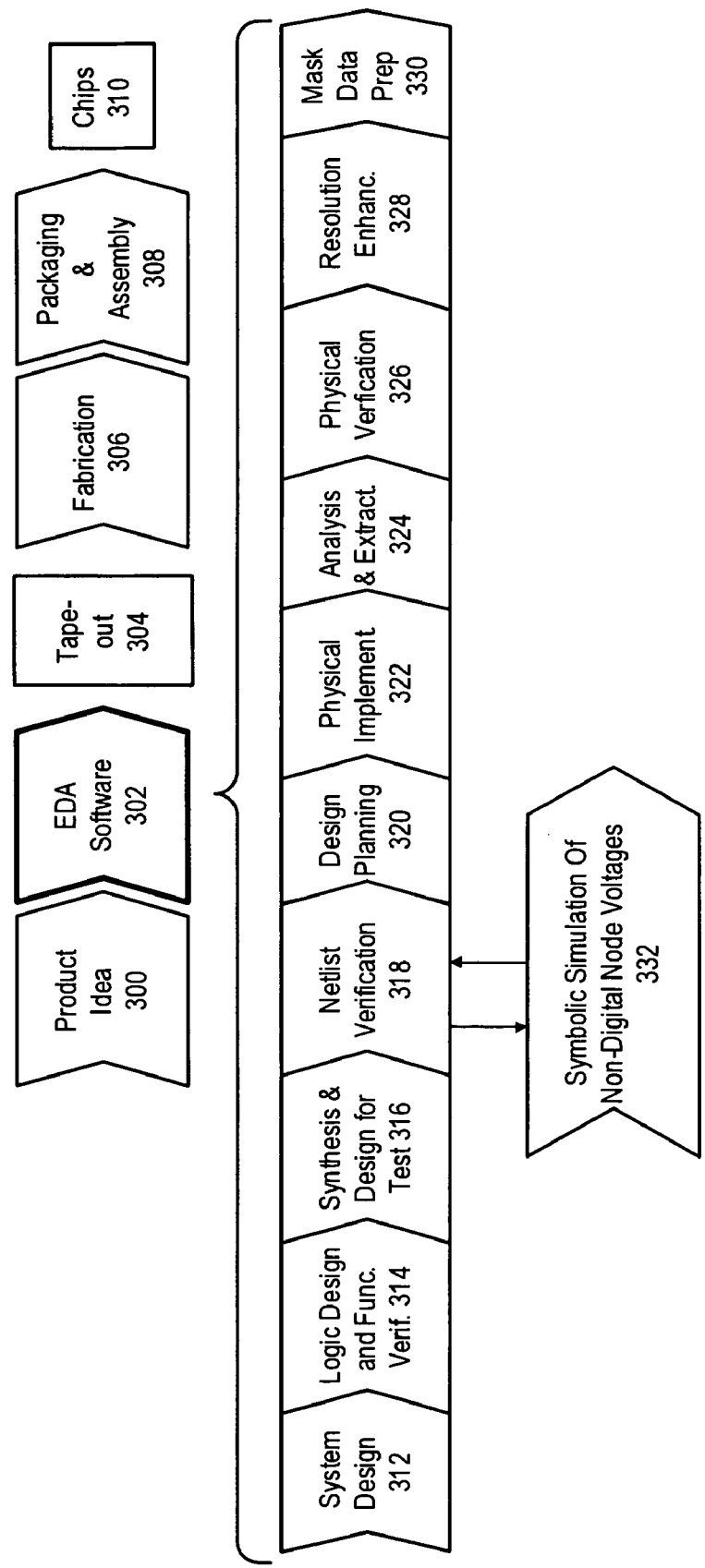
FIG. 3A is a flow chart of a digital ASIC design flow including the method of the invention.

Before proceeding further with the description, it may be helpful to place this process in context. FIG. 3A shows a simplified representation of an exemplary digital ASIC design flow. At a high level, the process starts with the product idea (step 300) and is realized in an EDA software design process (step 302). When the design is finalized, it can be taped-out (event 304). After tape out, the fabrication process (step 306) and packaging and assembly processes (step 308) occur resulting, ultimately, in a finished integrated circuit (IC) chip 310.

The EDA software design process (step 302) is actually composed of a number of steps 312-330, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components steps of the EDA software design process (step 302) will now be provided:

System design (step 312): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step 314): At this stage, the VHDL or Verilog code for modules in the system is written and the design is checked for functional accuracy. More specifically, does the design as checked to ensure that produces the correct outputs. Exemplary EDA software products from Synopsys, Inc. that can be used at this step include VCS, VERA, DesignWare®, Magellan, Formality, ESP and LEDA products.

Synthesis and design for test (step 316): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Physical Compiler, Test Compiler, Power Compiler, FPGA Compiler, Tetramax, and DesignWare® products.

Netlist verification (step 318): At this step, the netlist is checked for compliance with timing constraints and for correspondence with the VHDL/Verilog source code. Exemplary EDA software products from Synopsys, Inc. that can be used at this step include Formality, ESP, PrimeTime, and VCS products.

Design planning (step 320): Here, an overall floorplan for the chip is constructed and analyzed for timing and top-level routing. Exemplary EDA software products from Synopsys, Inc. that can be used at this step include Astro and IC Compiler products.

Physical implementation (step 322): The placement (positioning of circuit elements) and routing (connection of the same) occurs at this step. Exemplary EDA software products from Synopsys, Inc. that can be used at this step include the Astro and IC Compiler products.

Analysis and extraction (step 324): At this step, the circuit function is verified at a transistor level, this in turn permits what-if refinement. Exemplary EDA software products from Synopsys, Inc. that can be used at this step include AstroRail, PrimeRail, Primetime, and Star RC/XT products.

Physical verification (step 326): At this step various checking functions are performed to ensure correctness for: manufacturing, electrical issues, lithographic issues, and circuitry. Exemplary EDA software products from Synopsys, Inc. that can be used at this step include the Hercules product.

Resolution enhancement (step 328): This step involves geometric manipulations of the layout to improve manufacturability of the design. Exemplary EDA software products from Synopsys, Inc. that can be used at this step include Proteus, ProteusAF, and PSMGen products.

Mask data preparation (step 330): This step provides the "tape-out" data for production of masks for lithographic use to produce finished chips. Exemplary EDA software products from Synopsys, Inc. that can be used at this step include the CATSI family of products.

The computer program of this invention is an aspect of Netlist Verification (Step 318) and is represented by step 332 in FIG. 3A.

Figure 3B:
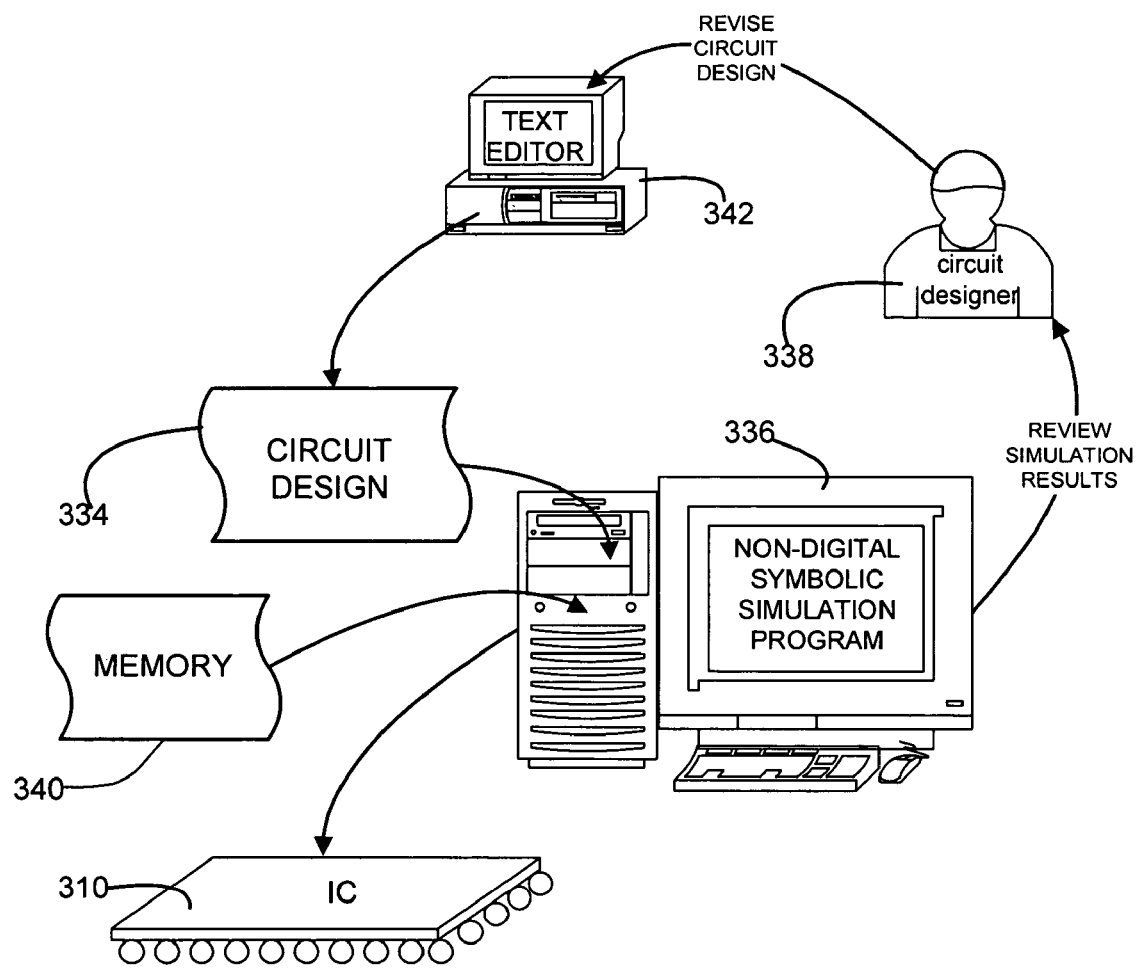
FIG. 3B illustrates a flow of information during the design of a circuit using the program of this invention.
Figure 4:
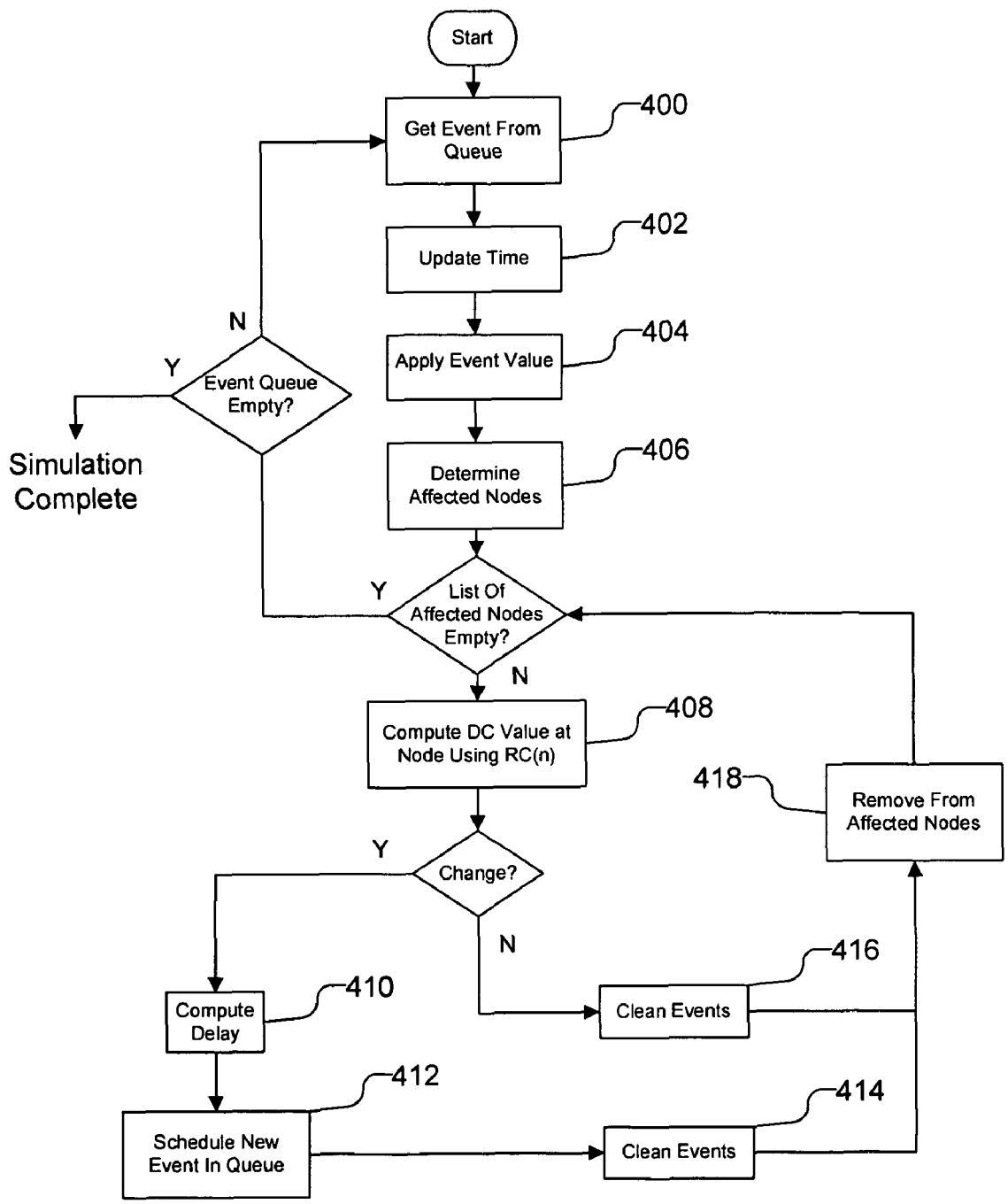
FIG. 4 illustrates a flow chart of the scheduling program which is used to implement the symbolic event handling procedure.

FIG. 3B illustrates the flow of information in some embodiments, wherein a circuit design 334 is analyzed by computer 336 that has been programmed to perform acts of the type illustrated in FIG. 4 and described elsewhere herein, and any results are then reviewed by chip designer 338. Computer 336 contains a memory 340 Chip designer 338 in turn revises the circuit design, by use of a text editor or a schematic entry program in a personal computer 342. Computer 342 may be a personal computer whereas computer 336 may be a Sun workstation. Note that a single computer may be used instead of two computers. When the circuit designer 338 is satisfied with the simulation results provided by computer 336, then the circuit design 334 may be taped out for fabrication into IC chip 310 in the normal manner. It will be understood that the arrow from computer 336 to finished chip 310 includes all of the process steps after Netlist Verification (step 318) in FIG. 3A.

Figure 3C:
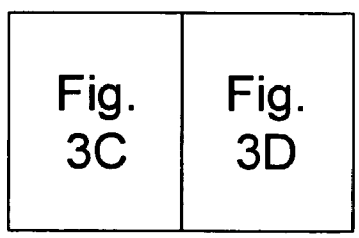

FIGS. 3C and 3D show a schematic view of memory 340 showing several of the data structures that are stored in memory 340 in the method of this invention.

FIG. 4 illustrates a flow chart for SymbolicSimulate, the basic scheduling program which is used to implement the symbolic event handling procedure. The program uses event queues, where an event is a change in the value function for a particular node in the circuit. Events are sorted in the event queue by increasing time.

The program shown in FIG. 4 can be represented in pseudo-code as follows:

```
SymbolicSimulate( )
    while ( <Node, Time, Event.Value, Mask> ← GetNext( ) )
        curtime ← Time
        Node.value ← ITE(Mask, Event.Value, Node.Value)
        N ← SymbolicAffectedNodes(Node)
        ∀n ∈ N
            newvalue ← SymbolicComputeDC(n)
            change ← newvalue XOR n.value
            if( change ≠ FALSE )
                T_delay ← SymbolicComputeDelay(n)
                T_delay ← MtbddITE(change, T_delay, [∞] )
                SymbolicSchedule (n, newvalue, T_delay )
            SymbolicCleanEvents( n, curtime, change' )
SymbolicSchedule( node n, BDD value, MTBDD T_delay )
    while( T_delay ≠ [∞] )
        dmin ← MtbddMinValue(T_delay )
        mask ← MtbddEqual(T_delay,dmin)
        time ← curtime+dmin
        SymbolicCleanEvents(n,time,mask)
        EnqueueEvent( <node,time,value,mask> )
        T_delay ← MtbddITE(mask,[∞], T_delay)
SymbolicCleanEvents( node n, real time, BDD mask )
    for each event such that (e.Node = node) • (e.Time>time)
        e.Mask ← e.Mask • mask'
        if e.Mask = FALSE
            Delete e from EventQueue
```

As the name implies, each circuit's node state in SymbolicSimulate is represented in a symbolic form. Rather than being a binary value 1 or 0, each node value is represented by a Boolean function of the variables applied to the input terminals of the circuit. All of the other quantities shown in boldface type in the code listing above are also Boolean functions. The Boolean functions are represented as Binary Decision Diagrams (BDDs) or Multi-Terminal Binary Decision Diagrams (MTBDDs). All BDD and MTBDD primitive operations are performed using the University of Colorado Decision Diagram Package (CUDD) version 2.2.0. See R. I. Bahar, E. A. Frohm, C. M. Gaona, G. D. Hachtel, E. Macii, A. Pardo, and F. Somenzi. Algebraic Decision Diagrams and Their Applications, *ACM/IEEE International Conference on Computer Aided Design*, pages 188-191, November 1993; F. Somenzi. *CUDD: CU Decision Diagram Package—Release 2.2.0, Online User Manual*, May 1998; each of which is incorporated herein by reference in its entirety.

To start the simulation, the input values to be executed are scheduled by placing them in an initial event queue. The simulator then executes all events in the event queue, computes new values for fanouts of the changed nodes, and schedules them back into the event queue. This process is repeated until the circuit reaches a steady-state, as signaled by an empty event queue.

Initially, at step 400, the program calls GetNext to obtain the next (earliest) event in the event queue. The event is represented by a tuple that includes (a) the identity of the node at which the event takes place, (b) the time, (c) the value of the event, which is the new DC voltage at the node, and (d) a mask. Both the value and the mask are symbolic values.

At step 402, the current time (curtime) is updated to the time of the event, and at step 404 the current value of the node (Node.value) may be updated to the value of the event (Event.Value), which is the voltage at the node at which the event occurs. The value of the node is updated, however, only if permitted by Mask, a Boolean function that essentially acts as a filter that defines when the state of the node will change. This is accomplished using an If-Then-Else (ITE) operator, which changes Node.value to Event.Value if Mask is true. The use of the Mask function in this manner solves the problem of scheduling data-dependent delays.

At step 406, the program identifies the nodes that will be affected by the event. To do this, it calls a subroutine called SymbolicAffectedNodes. The subroutine SymbolicAffectedNodes and the other subroutines referred to below in connection with basic scheduling program of FIG. 4 are described further below.

The program then cycles through the affected nodes to determine, for each affected node, whether the value (DC voltage) at that node will change as a result of the event and, if so, what the new value will be. This is represented at step 408 and is accomplished by calling a subroutine called SymbolicComputeDC which in turn, to allow for the non-digital voltage values in analog devices, calls another subroutine called RC. These stages of the program are represented in FIG. 4 by step 408 and the decision point after step 408 which asks whether the value at the node has changed as a result of the event.

If the value at the node has changed, the program calls a subroutine called SymbolicComputeDelay. SymbolicComputeDelay uses the resistance and capacitance associated with the node to compute an Elmore delay, which represents the time at which the new value will "arrive" at the node. This stage of the program is represented by step 410 in FIG. 4.

The new value at the node and the delay represent a new "event." Based on the delay (which is the time at which the event will occur in relation to the present time), the new event is placed at the proper place in the event queue. This is accomplished by calling a subroutine called SymbolicSchedule and is represented by step 412 in FIG. 4.

The program then calls a subroutine called CleanEvents. CleanEvents scans through the event queue to delete all events on the specified node that are scheduled to occur after the newly inserted event. This use of CleanEvents, immediately after the new event is enqueued, overrides previously computed node values that would take place after the newly-inserted event. This is necessary because the newly-inserted event represents the latest information about the node's steady-state value and should not be overwritten by long-delay events generated using old information. CleanEvents is represented by step 414 in FIG. 4, If the value at the node does not change as a result of the event, there is no need to schedule a new event in the queue, and steps 410 and 412 are omitted.

In some instances, the duration of a new event is shorter than the delay. For example, a 10 psec glitch may appear on the gate of a transistor whose gate capacitance produces a delay of 50 psec. In such cases, the output pulse needs to be suppressed because the input voltage will have returned to its original state before the voltage at the source or drain of the transistor can change. For this purpose, the program calls another version of CleanEvents, which cancels all future events at a node when the new value matches the current value. This use of CleanEvents is represented at step 416 in FIG. 4.

After the affected node has been analyzed, it is removed from the list of affected nodes (step 418), and the program proceeds to analyze the next affected node. This process continues until all of the nodes affected by the event have been analyzed. At this point, the program returns to step 400 to obtain the next event in the queue. When there are no events left in the queue, the circuit being simulated has reached a steady state and the simulation is complete until there is another change at the input terminals.

To summarize, the program illustrated in FIG. 4, in response to a change at the input terminals, identifies the affected downstream nodes, recomputes their steady-state node values, determines the delays to the affected nodes, and schedules the appropriate events.

With this overview of the basic program, the individual steps and subroutines will now be described in greater detail.

GetNext

As indicated above, each event in the queue is represented by a tuple which includes: (a) the identity of the node, (b) the time at which the event will occur, (c) the value, and (d) a mask. The "value" is the new value (DC voltage) that will be present at the node at the time of the event. The mask defines the circumstances under which the value at the node will change. Both the value and mask are Boolean expressions.

As described above, the program initially calls GetNext to obtain a new event (the next or earliest event in the queue) and then applies the If-Then-Else (ITE) logical operator to (Mask, Event.Value, Node.Value), "Node.Value" is the current value at the node; Event.Value is the new value at the node. If Mask is true, the value at the node is set to the new value; otherwise, the old value is retained. This sequence is represented by steps 400, 402 and 404 in FIG. 4.

Figure 5:
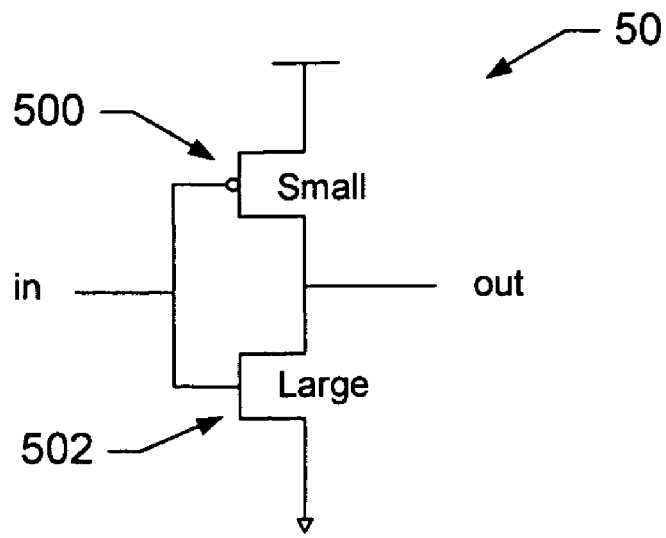
FIG. 5 is a schematic circuit diagram of a CMOS inverter.

The need for the Mask function in a system where delays are data-dependent can be illustrated by the CMOS inverter 50 shown in FIG. 5. Inverter 50 includes a high side PMOS transistor 500 and a low side NMOS transistor 502. Inverter 50 is unbalanced, meaning that low side transistor 502 is significantly larger than high side transistor 500. It is apparent that the delay in the change of the output in response to a change in the input will be different depending on whether the input goes from low to high or from high to low. If the input switches from the symbolic variable x to symbolic variable y either or both of which could represent 0 or 1, it is not obvious when the resultant event should be scheduled on the output. However, for any given input pattern, the output will transition at some well-defined point in time. When the input goes from high to low, the delay in the output will be greater than the delay when the input goes from low to high. Thus, the value of the output node at any time can be represented by a Boolean function of the input variables, and the full symbolic transition is actually a progression though a series of node functions.

Figure 6:
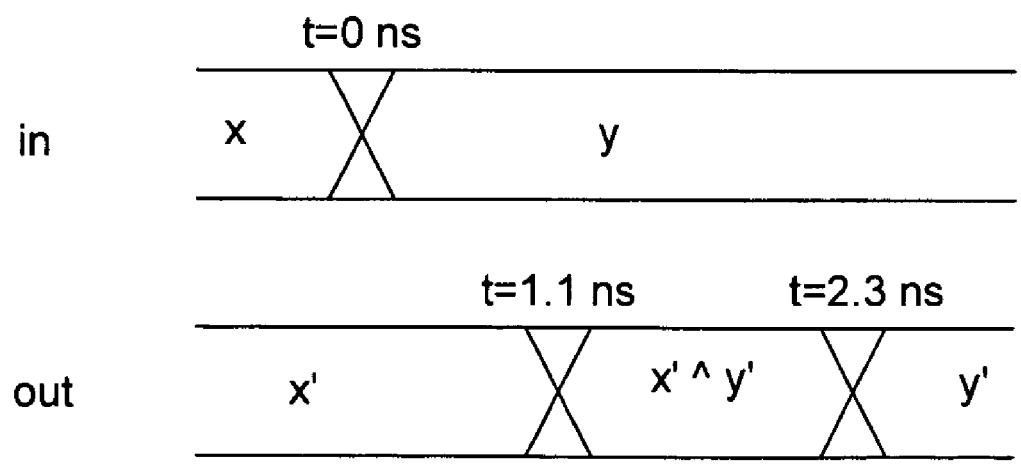
FIG. 6 is a timing diagram of the input and output of the CMOS inverter shown in FIG. 5.

Using this concept, one can construct a valid sequence of functions of the output node of unbalanced inverter 50. For example, assume that the delay at the output when the input goes from high to low is 2.3 ns and the delay at the output when the input goes from low to high is 1.1 ns. Two events would be scheduled at Time=1.1 ns and Time=2.3 ns, respectively, and we would obtain the series of three node functions shown in FIG. 6. Initially the output function is $\bar{x}$, and eventually it settles to $\bar{y}$. Since, at the output, a falling transition will occur at t=1.1 ns and a rising transition will not occur until t=2.3 ns, the only way that the output will be high in the interval between 1.1 ns and 2.3 ns is if x and y are 0 and the output remains high continuously. This behavior is captured in the function $\bar{x}\hat{}\bar{y}$. In general, the output node function will progress from being dependent only on the old input function variables to being dependent on the new input variables, and in between the output function will be dependent on a mix of the new and old input variables.

The Mask for the event at Time=1.1 ns would be $\bar{x}\hat{}y$ (representing a rising transition from x=0 to y=1) and the mask for the event at Time=2.3 ns would be $x\hat{}\bar{y}$ (representing a falling transition from x=1 to y=0), with Event.Value=$\bar{y}$ in both cases. When x=y (no change at the input), no event would be scheduled.

SymbolicAffectedNodes

Figure 7:
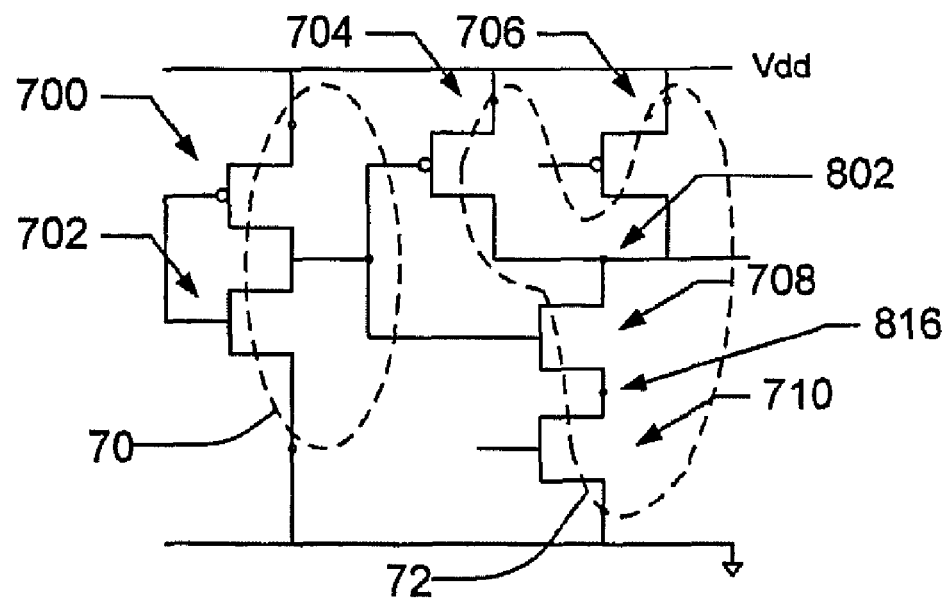
FIG. 7 is a schematic circuit diagram illustrating two channel connected regions (CCRs).

Next, the program calls SymbolicAffectedNodes, which determines which nodes will be affected by the transition at the node at which the event took place (step 406 in FIG. 4). The affected nodes (and, as described below, the node values and delays) are preferably computed by breaking the circuit into channel-connected regions and transforming each channel-connected region into an RC tree. A channel-connected region (CCR) is defined by an array of nodes that are connected to each other or to a voltage source only through transistor source-drain channels, without traversing a gate dielectric in any transistor. FIG. 7 shows two CCRs 70 and 72. The channels of transistors 700 and 702 are within CCR 70. The channels of transistors 704, 706, 708 and 710 are within CCR 72. A data set for each CCR is stored in the computer as a list of the nodes that are in the CCR as well as the maximum and minimum voltages in the CCR. This data set is represented by box 354 in FIG. 3D.

In addition, the data structure stored in the computer contains a list of the nodes (or nets) in each CCR, including for each node: (a) the name of the node, (b) the "type" of the node (i.e., whether it is a voltage source or not), (c) the capacitance of the node, (d) a list of the transistor connections to the node, (e) the value (i.e. voltage) of the node (as explained further below, this value is expressed in Boolean form as a multi-terminal binary decision diagram (MTBDD)), and (f) the identity of the CCR in which the node is located. The data structure for a list of nodes is represented by box 352 in FIG. 3C. The data structure also includes a list of the transistors in each CCR, identified by: (a) the nodes to which the gate, source and drain terminals, respectively, are connected, (b) a piece-wise linear lookup table that is used, as described below, to compute the channel resistance of the transistor as a function of the gate-to-source voltage, (c) the width and length of the transistor's channel, and (d) the "type" of the transistor (i.e., whether N-channel or P-channel). (Note: in some publications nodes are referred to as "nets." As used herein, the word "node" and "net" are synonymous unless the context indicates otherwise.) The data structure for the list of transistors is represented by box 356 in FIG. 3D.

An RC tree for each CCR is formed by replacing each conducting transistor with a resistor and connecting a grounded capacitance to each node. As described below, the equivalent resistance for each transistor depends on the size of the transistor, the gate-source voltage (Vgs) and some pre-computed process information (from a default process if none is supplied).

Figure 8:
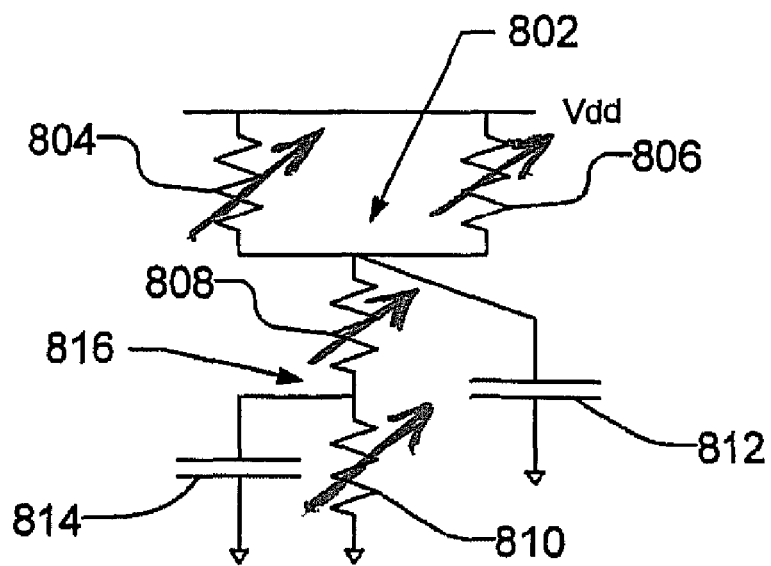
FIG. 8 illustrates an RC tree for one of the channel connected regions shown in FIG. 7.

A corresponding RC tree for CCR 72 in FIG. 7 is shown in FIG. 8. The size of the capacitance that is connected to each node in the RC tree is computed by summing all gate, drain and source capacitances that are connected to the node, as well as any explicit capacitances that are in the netlist. For example, in FIG. 8, resistors 804, 806, 808 and 810 are replacements for transistors 704, 706, 708 and 710, respectively in FIG. 7. The capacitance 812 connected to node 802 is equal to the sum of the drain capacitances of transistors 704, 706 and 708. The capacitance 814 connected to node 816 is equal to the drain capacitance of transistor 710.

SymbolicAffectedNodes performs a computation of the set of downstream nodes in a CCR that will need to be recomputed. It is not necessary to consider all nodes in a CCR because some of the nodes may be reachable only through transistors that are currently turned off. Thus SymbolicAffectedNodes reduces the number of nodes that must be evaluated. For small CCRs such are those which represent simple logic gates, it probably would not be efficient to run SymbolicAffectedNodes, since a minimal number of nodes are excluded. For large CCRs such as those which represent barrel-shifters or SRAMs, however, the number of unnecessary evaluations could become prohibitive.

The following is a pseudo-code representation of SymbolicAffectedNodes:

```
SymbolicAffectedNodes( node n )
A ← 0
∀t such that t.gate = n
    A ← A ∪ SymbolicAffectedRecur(t.source,0,TRUE)
    A ← A ∪ SymbolicAffectedRecur(t.source,0,FALSE)
Return A
SymbolicAffectedRecur( node n, transistor via, BDD active )
    loop ← active ∧ n.reached
    if( loop ≠ FALSE)
        via.broken ← via.broken ∨loop
        reached ← reached ∧ loop
        if( active = FALSE) return 0
    n.reached ← n.reached ∨active
    A ← n
    ∀t ≠ via such that t.source = n or t.drain = n
        if( n = t.source )
            other ← t.drain
        else
            other ← t.source
        nextactive ← active ∧ SymbolicTransparent(t)
        if( nextactive ≠ FALSE )
            A ← A ∪ SymbolicAffectedRecur( other,t,nextactive)
    return A
SymbolicTransparent( transistor t )
    if( t.type = NFET )
        return t.gate.value ∧ t.broken
    if( t.type = PFET )
        return t.gate.value ∧ t.broken
```

SymbolicAffectedNodes performs a depth-first search, starting at the sources and drains of all transistors whose gates are connected to the switching node. SymbolicAffectedRecur performs a recursive depth-first search through source/drain connections. All nodes discovered are added to the list of affected nodes, and transistors are marked with a broken flag if they lead to a previously reached node. This program dynamically identifies the nodes that make up the CCRs affected by the transitioning node.

The program is complicated by the fact that transistor-gates can have symbolic state values. Thus, each transistor may be "transparent" only under certain input assignments. Furthermore, it is possible to reach a node several times under mutually disjoint sets of input assignments without being forced to break loops. In fact, the transistor broken flag itself must also be symbolic, since there will be input assignments for which the transistor closes a loop, and others for which it does not.

Figure 9:
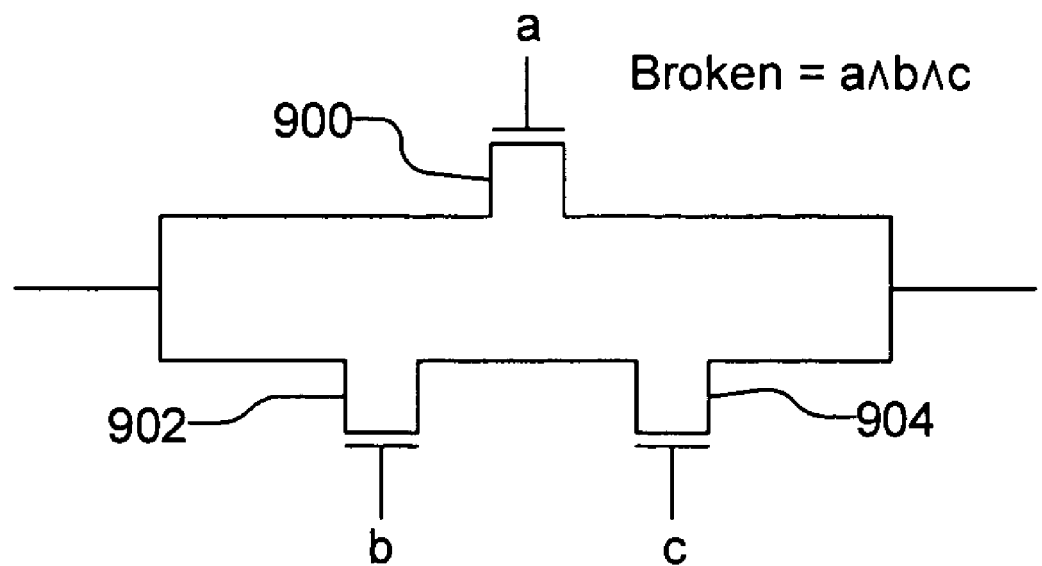
FIG. 9 is a schematic circuit diagram of a data dependent loop.

For example, the circuit shown in FIG. 9, contains a data-dependent loop. Since the gates of transistors 900, 902 and 904 have symbolic values, they will only form a loop when a, b and c are all 1. This means that the broken flag must be set for at least one of transistors 900, 902 and 904 to the function (a^b^c). It does not matter which transistor the flag is set for, and this will be determined by the order in which the transistors happen to be identified. With the broken flag set as shown in FIG. 9, transistor 900 will be considered non-conducting under all input assignments that satisfy the function (a^b^c).

Continuing with the description of SymbolicAffectedNodes, at each node a BDD, Node.reached, is maintained to keep track of input assignments under which the node has already been reached. Also, at each level of recursion, we keep track of the input assignments for which each node is still active. We return when this active BDD becomes FALSE or no unexplored transistors remain. When the active function intersects the Node.reached function, the result (loop) gives the input assignments under which this node was reached multiple times. The value of loop is used to compute a new broken flag, and then to deactivate further search under those input conditions. If the active function becomes FALSE, then the recursion terminates.

After SymbolicAffectedNodes has been completed, all loops have been removed and the CCR forms a tree.

SymbolicComputeDC (RC)

The next step of the process is to compute a new steady state value for each of the affected nodes (step 408 in FIG. 4). This is done using the routine SymbolicComputeDC, which in turn calls the subroutine RC. Essentially, RC explores outward along each branch of the RC tree in a depth-first manner until it reaches Vdd, GND or a non-conducting transistor. The program then works backwards, computing the resistance of series and parallel combinations of branches.

Each node of the tree is represented by the tuple (U, D, H, L), where:
  U is the equivalent resistance from the node to Vdd
  D is the equivalent resistance from the node to GND
  H is the effective capacitance of the node charged high
  L is the effective capacitance of the node discharged RC first determines whether the node corresponds to a supply voltage and returns the appropriate tuple. If the node is at Vdd, the tuple $\{0, \infty, 0, 0\}$ is returned; if the node is at ground, the tuple $\{\infty, 0, 0, 0\}$ is returned.

In accordance with the invention, the subroutine RC also allows for the possibility that the node corresponds to a supply voltage between Vdd and ground. Such intermediate voltages are represented by creating phantom voltage dividers with small resistances between Vdd and ground. To avoid introducing errors, the resistance values used must be significantly smaller than the resistances in the RC tree. There are numerous ways of generating the phantom voltage dividers. In one method, the pull-up resistor is selected to be a small number K (e.g., 10 ohms) and the pull-down resistor is limited to a maximum value M (e.g., 1000 ohms). Limiting the size of the pull-down resistor limits the maximum error introduced, but it also limits the maximum voltage that can be represented.

At the cost of extra computation, the values of the pull-up and pull-down resistors in the phantom voltage divider can be determined dynamically. Using Vi as the intermediate supply voltage and K as the value of the pull-up resistor, the value of the pull-down resistor is:

$$K*V/(1-V)$$

where V=(Vi−Vmin)/(Vdd−Vmin), Vmin being the lowest supply voltage.

Thus, if the node represents a supply voltage between Vdd and ground, RC returns the tuple $\{K, K*(V/(1-V)), 0, 0\}$ For affected nodes that do not correspond to a supply voltage, RC next computes the capacitance at the node. Two values of capacitance are computed, one for the node charged high (H, which represents the sum of all capacitances in the channel-connected region that are currently charged high)

and another for the node charged low (L, which similarly represents the sum of discharged capacitances).

Figure 10:
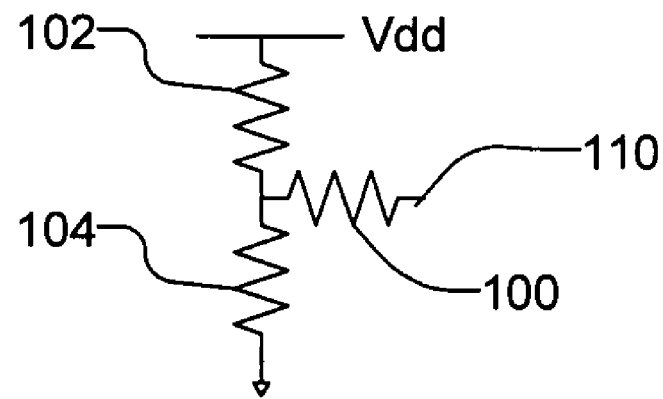
FIG. 10 is a schematic circuit diagram showing a node having pull-up and pull-down resistances that overlap.

Next, RC determines the effective pull-up and pull-down resistance for the node (U and D in the tuple). The effective pull-up resistance is the resistance between the node and Vdd; the effective pull-down resistance is the resistance between the node and ground. For example, in FIG. 8, the pull-down resistance of node 802 is equal to the sum of the series resistors 808 and 810, or R808+R810. The pull-up resistance of node 802 is equal to the parallel combination of the resistors 804 and 806, or R804\*R806/(R804+R806). If the paths from the node to Vdd and ground overlap, the computation is a little more complicated. As shown in FIG. 10, where R100 is the resistance of the overlap path, the effective pull-up resistance of node 110 is equal to R102+R100(1+R102/R104) and the effective pull-up resistance of node 110 is equal to R104+R100(1+R104/R102).

In the digital portions of the circuit, each transistor is assumed to be either fully turned on or fully turned off, and its resistance is therefore assumed to be either 0 or ∞. If the circuit contains analog devices, however, this assumption does not apply, since the resistance of a transistor in an analog device may vary over a continuum from its fully-turned-on resistance to infinity, its actual resistance depending on the size and other characteristics of the transistor and its gate-to-source voltage (Vgs).

In accordance with this invention, to determine the resistance of a transistor in an analog device, the program first computes Vgs. For an N-channel transistor, it is assumed that the source voltage is equal to the lowest voltage in the CCR. For a P-channel transistor, it is assumed that the source voltage is equal to the highest voltage in the CCR. As noted above, the stored data structure for each CCR includes the maximum and minimum voltages in the CCR. Vgs is used to perform a look-up in a piece-wise linear model to identify a factor that is representative of the channel resistance of the transistor. The look-up table can be extracted from a circuit simulation device model, or it can be based on a typical process if a device model is not available. Modern integrated circuit manufacturing processes typically provide four to six types of transistors (for example, high-Vt nmos, low-Vt nmos, high-Vt pmos, low-Vt pmos), each of which is specified in a circuit simulation device model, such as SPICE. To construct a lookup table from a SPICE model, a transistor of representative size (user-definable, or selected from the middle of the allowable size range) is simulated in SPICE, and its drain-source resistance is measured for several values of Vgs. A channel sheet resistance (ρ) corresponding to each Vgs is computed by multiplying the measured drain-source resistance by the transistor's channel width and dividing by its channel length. These sheet resistance values are written to a file for later use by our simulator.

Figure 11:
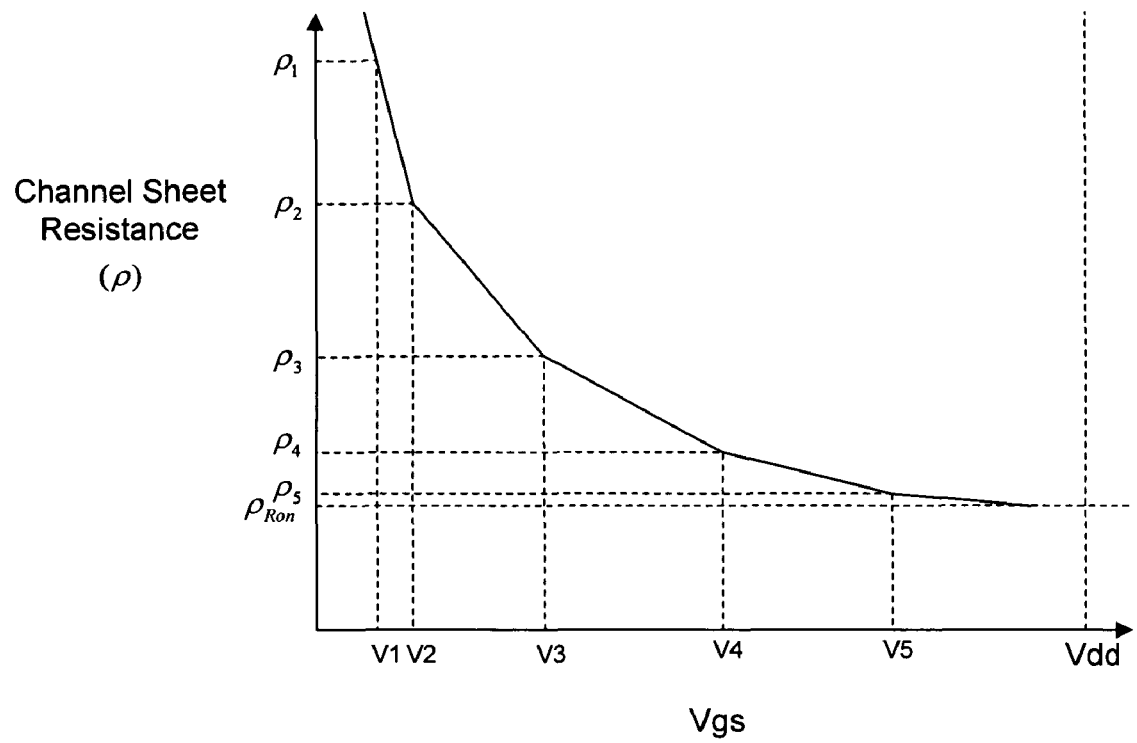
FIG. 11 a graph of the channel resistance of a transistor as a function of Vgs.

For example, FIG. 11 shows a typical graph of the channel sheet resistance of a transistor as a function of Vgs. There are five datapoints in the graph, representing channel sheet resistances ρ1 through ρ5. From this graph, a piece-wise linear lookup table is prepared with the channel sheet resistance corresponding to each value of Vgs:

| ρ   | ρ1 | ρ2 | ρ3 | ρ4 | ρ5 |
|-----|----|----|----|----|----|
| Vgs | V1 | V2 | V3 | V4 | V5 |

The piece-wise linear lookup table is stored in memory 340 and is represented by box 350 in FIG. 3C. The piece-wise linear lookup table is also stored as a part of the transistor list (box 356).

To determine the resistance of a particular transistor with a given Vgs, the appropriate table is selected based on the transistor's type, which is normally specified in the SPICE deck or other listing of devices in the circuit. The sheet resistance is determined by linearly interpolating between the two closest Vgs values in the table, or by extrapolation if the transistor's Vgs lies outside the table's range. The sheet resistance is then multiplied by the transistor's channel length and divided by its channel width to determine its channel resistance.

In other embodiments of this invention, a factor other than the channel sheet resistance may be used in the piece-wise linear lookup table to represent the channel resistance of the transistor. For example, in some embodiments the factor can be the actual channel resistance of the transistor for each value of Vgs may be stored in the lookup table for the transistor. In such cases, the program, after determining Vgs, goes to the lookup table and, interpolating or extrapolating as necessary, determines the channel resistance that corresponds to Vgs. In other embodiments the factor could be a scaling factor which, when multiplied by the on-resistance of the transistor, yields its channel resistance.

When the recursive tree exploration terminates, RC returns a tuple representing the parallel composition of all branches leading from the starting node. Using this tuple and the voltage-divider equation given above, SymbolicComputeDC computes a normalized steady-state voltage. In the digital portions of the circuit, the program determines whether the voltage at the node represents a logical 0 or 1.

After RC has computed the pull-up and pull-down resistances, U and D, SymbolicComputeDC determines the node voltage, Event.Value, by using the voltage-divider equation, i.e. Event.Value=GRD+(Vdd−GRD)\*D/(D+U).

The following is a pseudo-code representation of SymbolicComputeDC:

```
SymbolicComputeDC(N)
    {U, D, H, L} = RC(N)
    Return ( GND + (D/U+D) (Vdd − GND) )
RC(N)
    If ( N.type == supply )
        If (N.voltage == Vdd) Return {0,∞,0,0}
        Else If ( N.voltage == GND) Return {∞,0,0,0}
    Else
        V = N.voltage − GND/Vdd − GND
        Return { K, K*(V/(1−V)), 0, 0}
    {U,D,H,L} = {∞,∞,0,0}
    H = Cn * (N.voltage − GND) / (Vdd − Gnd)
    L = Cn * (Vdd − N.voltage) / (Vdd − Gnd)
    For all edges (N,N2)
        Re = ChannelResistance ( R, Type, Vgate, Vdd, GND )
        {U,D,H,L} = Parallel ( {U.D.H.L}, Series ( RC(N2), Re ) )
    Return {U,D,H,L}
```

The operators Series and Parallel are defined as follows:

```
Series ( {U,D,H,L}, Re )
    Return {U+Re(1+U/D), D+Re(1+D/U), H*D/(D+Re), L*U/(U+Re) }
Parallel ( {U1,D1,H1,L1}, {U2,D2,H2,L2} )
    Return {U1||U2, D1||D2, H1+H2, L1+L2 }
```

Note that in the foregoing pseudo-code, the symbol "||" represents the equivalent resistance of a parallel combination of resistors.

It should be noted that it is generally more efficient to use the RC subroutine only in the analog portions of a digital/analog circuit. A simple heuristic can be used to identify which parts of the circuit are analog by searching for "self-feedback" CCRs, wherein a node in the CCR is connected to a gate of a transistor in the same CCR. Self-feedback CCRs are normally within analog devices. Non self-feedback CCRs are normally within digital circuits. This heuristic can be used when compiling the netlist. Alternatively, the user can declare certain parts of the circuit to be analog.

Next, the program computes the delay at the node (step 410 in FIG. 4). The delay at a node is determined by calculating an "effective capacitance" and using the effective capacitance to compute the "Elmore delay." Technically, the Elmore delay of an RC tree is the first time-constant of the step response, which provides a good estimate of the switching delay of the output when the inputs are assumed to switch instantaneously. An intuitive method of calculating the Elmore delay is to multiply each capacitor in the tree by the resistance from that capacitor to the supply. For example, referring to FIG. 8, the Elmore delay of node 802 would be equal to C814(R810)+C812(R810+R808).

Figure 12:
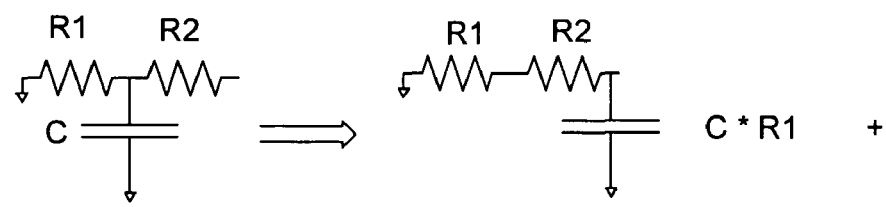
FIG. 12 is a circuit diagram illustrating the translation of capacitances across resistances to obtain the effective capacitance at a node.

Since the resistances to the node are already known from the computation of the node value, it is convenient to "sum" the capacitances so as to obtain the effective capacitance at the node being analyzed. This can be done by "translating" the capacitances across the resistances to the node being analyzed and then adding all of the capacitances at the node together to obtain the effective capacitance at the node. The equation for translating capacitances across a resistor R1 that is in series with another resistor R2, as shown in FIG. 12, is C*R1/(R1+R2). Applying this equation to translate capacitance 814 across resistor 808 in FIG. 8, we get C814*R810/(R810+R808). Thus the total capacitance used in computing the delay at node 802 is C812+(C814*R810/(R810+R808)), and the Elmore delay at node 802 is equal to the total capacitance at node 802 multiplied by the total resistance between the supply voltages and node 802, or (C812+(C814*R810/(R810+R808)))*(R810+R808+((R804*R806)/(R804+R806))).

As noted above, the tuple for each node includes two effective capacitances, H and L. To obtain the value of H, only the capacitances of those nodes that are charged high are summed. To obtain the value of L, only the capacitances of those nodes that are charged low are summed. Thus H is the effective capacitance at the node for a falling transition and L is the effective capacitance at the node for a rising transition.

Figure 13:
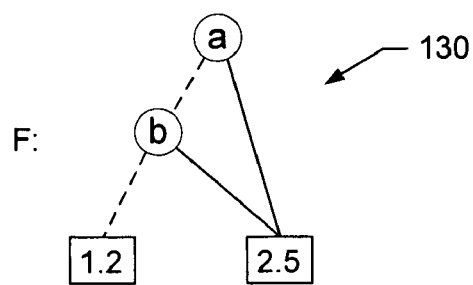
FIG. 13 shows a Boolean function represented by a multiterminal binary decision diagram (MTBDD).

As noted above, many of the values in the above-referenced programs are represented as symbolic, specifically Boolean, expressions. These Boolean expressions can be conveniently presented as MTBDDs. FIG. 13 shows a Boolean function F that is represented by an MTBDD 130. The inputs are represented as "a" and "b" within circles; the terminals (outputs) are presented by the numerical values in the boxes. A solid line extending from an input circle represents a "1" for that input; a dashed line extending from a circle represents a "0" value for that input. Thus the function F represented in FIG. 13 is equivalent to:

$$F = 1.2 \text{ if } \overline{a} \cdot \overline{b}$$

$$F = 2.5 \text{ if } a + \overline{a} \cdot \overline{b}$$

Figure 14:
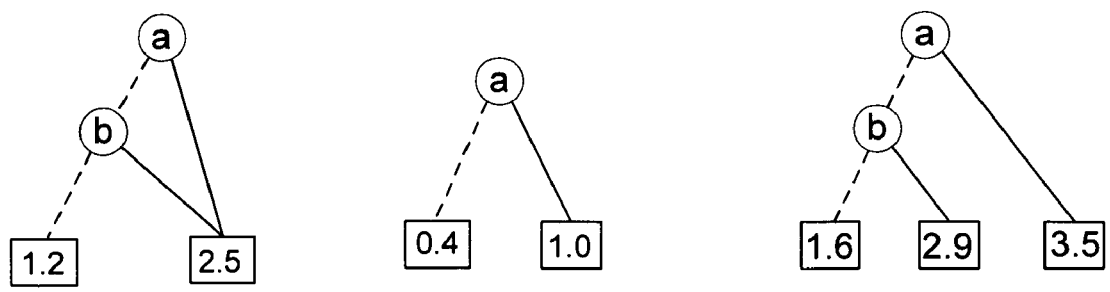
FIG. 14 illustrates the addition of two MTBDDs to obtain a third MTBDD.

Algebraic operations such as addition or multiplication can be applied to MTBDDs. FIG. 14 shows the result of adding the MTBDD representing the function F to an MTBDD representing the function G to obtain a function H represented by a third MTBDD. For (a=0, b=0), $H_0 = F_0 + G_0 = 1.2 + 0.4 = 1.6$, and similarly for the other operators.

Figure 15:
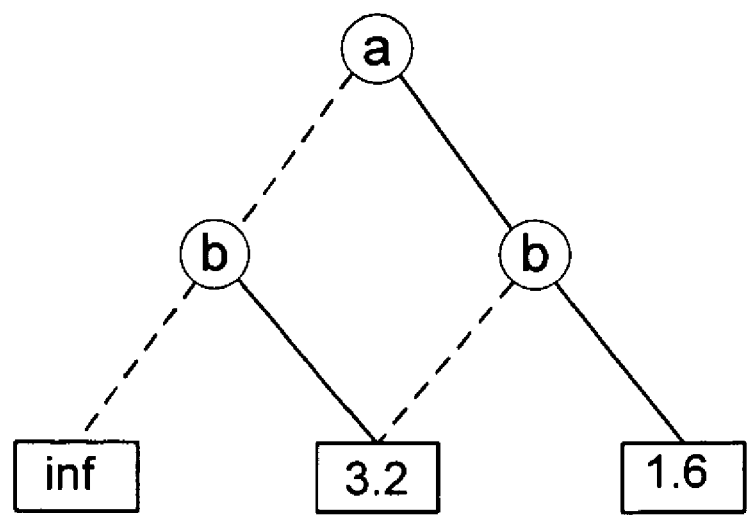
FIG. 15 shows an MTBDD that represents the resistance of the parallel combination of resistors shown in FIG. 16.
Figure 16:
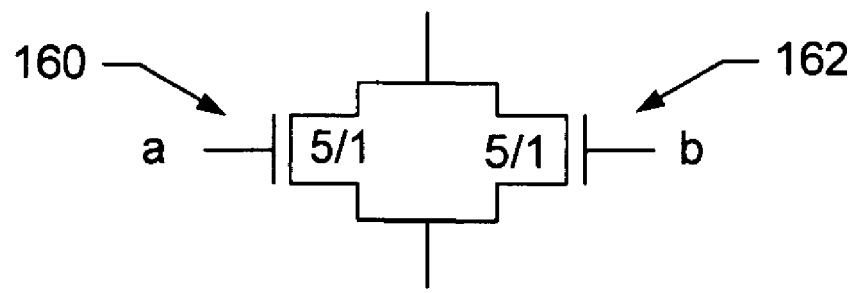
Figure 17:
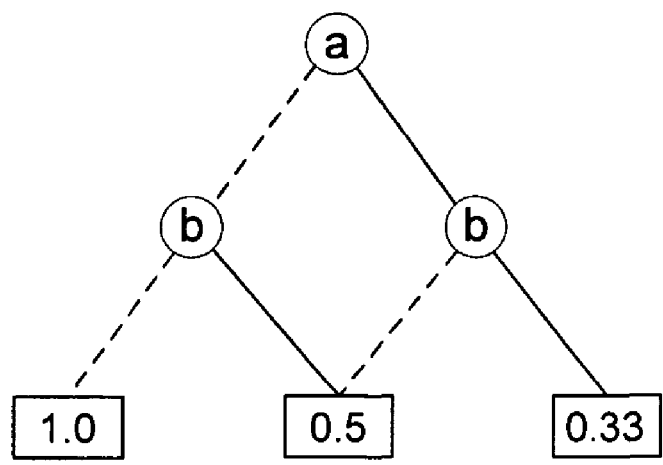
FIG. 17 shows an MTBDD that represents the voltage at node c in FIG. 18.

Both resistances and node voltages can be stored as MTBDDs. For example, the MTBDD shown in FIG. 15 represents the resistance of the parallel combination of resistors 160 and 162 shown in FIG. 16. And the MTBDD shown in FIG. 17 represents the voltage at node c in FIG. 18.

Alternatively, the Boolean functions representing the node voltages and resistances can be stored in forms other than MTBDDs, for example, a list of (function,value) pairs, wherein the "function" is a Boolean function that is true whenever the "value" is to be returned. Thus, the expression "If A, then 5, else 10" can be represented as {(A,5),(not A,10)}. As subcategories of this technique, the "function" can be represented in any of a multitude of ways that have been developed for storing Boolean functions, including textual expressions, truth tables, clause lists, binary decision diagrams (BDDs), Boolean expression diagrams (BEDs), and And-Invert graphs. Textual expressions are classical Boolean expressions, represented as a text string or decomposed into a parse tree. Truth tables are well-known and need not be further described here. Clause lists can be represented in a conjunctive normal form (CNF) as a product of sums representation, such as (A+!B+C)*(A+B), or in a disjunctive normal form (DNF) as a sum of products representation, such as (A*!B*C)+(A*B). (Note that in the preceding sentence "+" means "or", "*" means "and", and "!" means "not".) In CNF, each sum term is a "clause," and the total expression can be represented as a list of these clauses; in DNF, each product term is a "clause," and the total expression can be represented as a list of these clauses.

BDDs are well-known representations that are employed in the digital domain. (See "Graph-Based Algorithms for Boolean Function Manipulation," IEEE Transactions on Computers, Vol. C-35, No. 8, August 1986, pp. 677-691.) BEDs are a generalization of BDDs that allow operator nodes such as AND, OR and NOT. (See H. Anderson and H. Hulgaard, Boolean Expression Diagrams, In LICS, 1997.) And-Invert graphs are directed acyclic graphs wherein each node is an AND operator and each edge is either negating or non-negating. The leaves of the graph are the input variables. (See A. Kuehlmann and F. Krohm, "Equivalence Checking Using Cuts and Heaps," Proceedings of the Design Automation Conference (DAC97), Annaheim, Calif., June 1997, pp. 263-268.)

In addition to the various forms of (function,value) pairs, the information can also be stored as truth tables, binary moment diagrams (BMDs), and *PHDDS. BMDs are a method of symbolically representing linear functions of digital inputs that return integers. (See R. E. Bryant and Y.-A. Chen, "Verification of Arithmetic Circuits Using Binary Moment Diagrams," Software Tools for Technology Transfer, Springer-Verlag, Vol. 3, No. 2 (May 2001), pp.137-155.) *PHDDs are a generalization of BMDs that allow real-valued return values. (See Y.-A. Chen and R. E. Bryant, "*PHDD: An Efficient Graph Representation for Floating Point Circuit Verification," International Conference on Computer-Aided Design (ICCAD97), November 1997, pp. 2-7.) Each of the references cited in this and the preceding paragraphs are hereby incorporated herein by reference.

The program of this invention is also able to handle unknown input values by allowing node voltages and transistor resistances to be min-max ranges. Unknown input values may occur under three scenarios. First, they may be applied to the primary inputs of the design being verified, in order to test that the correctness of the design under some conditions where a given input should not matter. Second, unknown values may occur on internal nodes of the design when a node is temporarily disconnected from all drivers, and is left floating. Third, they may also occur at the boundaries between digital and analog portions of the design, since the digital simulation program produces unknowns when a non-digital voltage is discovered on a node that is expected to be digital.

In the digital simulation program, unknown input values at the gate of a transistor result in that transistor having a resistance ranging between its fully conducting value and infinity. When such an unknown value propagates to an analog device, because normally other inputs are also present, the voltage at a node, e.g., the gate of a transistor, can be represented as a min/max range. In accordance with this invention, unknown voltages are represented as ranges, resulting in a min-max range of Vgs values at the gates of transistors. This in turn results in a range of resistances for the transistor, and a corresponding range of voltages at other nodes in the transistor's channel-connected region. In this way, completely unknown inputs may result in outputs that are known to lie within a particular range, and the full effects of unknown inputs can be propagated through the analog circuit.

Each resistance term in the tuple {U, D, H, L} is actually a pair of min/max values, each of which is an MTBDD. Thus the tuple is actually in the form {Umax, Umin, Dmax, Dmin, H, L}. Normally, when unknown inputs are not involved, the min/max values are the same. The program checks pointers to determine if the min/max values are the same and, if they are not, it uses the minimum and maximum values to compute minimum and maximum pull-up and pull-down resistances and node values.

Several examples will be useful in explaining the invention. The first example illustrates the determination of the channel resistance of a transistor using a piece-wise linear lookup table. The second example illustrates the analysis of a circuit that contains and intermediate voltage source between the high and low voltage sources. The third example illustrates the use of minimum and maximum values to deal with unknown input values.

EXAMPLE 1

Figure 19:
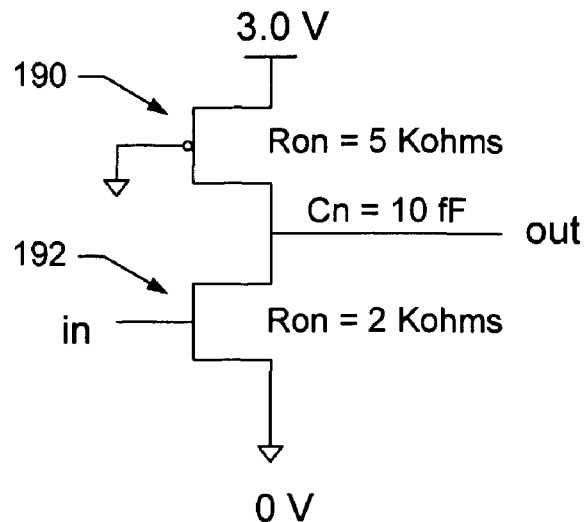
FIG. 19 is a circuit diagram for illustrating how symbolic gate voltages are dealt with and how a new value and delay at an output node are computed as a result of a change at an input node.

The circuit shown in FIG. 19 has an output node driven by two transistors 190 and 192. The input node is the gate of transistor 192. This example will illustrate how symbolic gate voltages are dealt with and how a new value and delay at the output node are computed as a result of a change at the input node.

The high-side transistor 190 is a P-channel transistor whose gate is grounded and hence is turned on. Transistor 190 has an on-resistance of 5 Kohms. The low-side transistor is an N-channel transistor with an on-resistance of 2 Kohms. Since transistor 190 is turned on, the output node is charged high to 3V, and it has an effective capacitance in that state of 10 fF.

The input node transitions at time t=0 from 0.0V to a voltage defined by the symbolic expression, "If A then 2V, else 0V." The value and delay at the output node are to be computed.

First, the tuple {U,D,H,L} at the output node is computed. SymbolicComputeDC(out) calls RC(out). RC(out) determines that the output node is not at a supply voltage and hence sets the tuple initially at {∞,∞,0,0}.

Since the output node is charged high, H in the tuple is set at 10 fF, so the tuple becomes {∞,∞,10fF,0}.

The program then computes the value of the pull-up resistance. It calls RC(Vdd). Since Vdd is the high-side supply voltage, it returns the tuple {0,∞,0,0}. Since transistor 190 is turned on, it provides a resistance of 5 Kohms. Thus ComputeSeries(5 Kohms, {0,∞,0,0}) gives {5 Kohms,∞,0,0}. ComputeParallel({∞,∞,10fF,0}, {5 Kohms,∞,0, 0}) gives {5 Kohms,∞,10fF,0}.

Thus far, the program has determined that the pull-up resistance for the output node is 5 Kohms and that the output node has a capacitance charged high of 10 fF. Next, the program looks at the effects of the pull-down resistance.

The program first calls RC(Gnd) and returns the tuple {∞,0,0,0}. The channel resistance of transistor 192 depends on its Vgs. Since the source voltage of transistor 192 is equal to zero, and its gate voltage is equal to the voltage at the input node, its Vgs is equal to "If A then 2.0V, else 0.0V."

To determine the channel resistance of transistor 192, the program does a lookup in the piece-wise linear table (box 350 in FIG. 3C) that describes the channel sheet resistance (ρ) of transistor 192 as a function of its Vgs.

Assume that as a result of the table lookup the program determines that:

for Vgs=2.0V, the channel sheet resistance of transistor 192 is equal to 10 Kohms/square for Vgs=0.0V, the channel sheet resistance of transistor 192 is infinite The program next checks the transistor list (box 356 in FIG. 3D) to determine the channel length and channel width of transistor 192. Assuming that the channel length is 0.1μ and the channel width is 0.33μ, the program multiplies the channel sheet resistance by 0.1μ and divides the product by 0.33μ and thereby determines that the resistance of transistor 192 is equal to "If A then 3 Kohms, else ∞."

Next, the program runs the Series operator to compute the series combination of transistor 192 and the Gnd node, and then calls the Parallel operator to combine the effects of the paths from the output node to Vdd and from the output node to Gnd. ComputeSeries("If A then 3 Kohms, else ∞", {∞,0, 0,0}) gives {∞,"If A then 3 Kohms, else ∞",0,0}. ComputeParallel({5 Kohms,∞,10fF,0}, {∞,"If A then 3 Kohms, else ∞",0,0}) gives {5 Kohms,"If A then 3 Kohms, else ∞",10 fF,0}.

Thus, as a result of its analysis of the output node, RC(N) returns the tuple {5 Kohms,"If A then 3 Kohms, else ∞",10 fF,0}. In effect, this indicates that:

the pull-up resistance (U) is equal to 5 Kohms the pull-down resistance (D) is equal to "If A then 3 Kohms, else ∞"

the capacitance charged high (H) is equal to 10 fF the capacitance charged low (L) is equal to 0

SymbolicComputeDC then uses these values to compute the new voltage at the output node. This is done in two stages by computing a normalized voltage (D/(U+D)) and then computing the actual voltage by multiplying the normalized voltage by (Vdd-Gnd) and adding the result to Gnd.

The normalized voltage is equal to:

$$\frac{\text{"If } A \text{ then 3 Kohms, else } \infty\text{"}}{5 \text{ Kohms} + \text{"If } A \text{ then 3 Kohms, else } \infty\text{"}}$$

which is equal to "If A then 3/8, else 1."

The actual voltage at the output node is equal to 3.0V*("If A then 3/8, else 1"), or "If A then 9/8V, else 3.0V." Since the current voltage at the output node is 3.0V, this means that if A is true the voltage falls at the output node falls from 3.0V to 9/8V; otherwise, the voltage at the output node remains at 3.0V.

In order to schedule a new event the delay must be computed. It is clear that if A is not true, the voltage at the output node does not change (i.e., the delay is infinite). If A is true, the voltage at the output node falls from 3.0V to 9/8V. The delay is computed as "If rising then U*L, else D*H", which gives "If A then 30 ps, else 0." The delay is equal to D*H=3 Kohms*10 fF=30 ps.

As indicated above, each event in the queue is represented by a tuple which includes: (a) the identity of the node, (b) the time at which the event will occur, (c) the value, and (d) a mask. Thus a new event with be scheduled in the queue indicating that the value at the output node will change to 9/8V at t=30 ps if A is true. The mask is A, meaning that the voltage at output node will change only if A is true.

EXAMPLE 2

Figure 20:
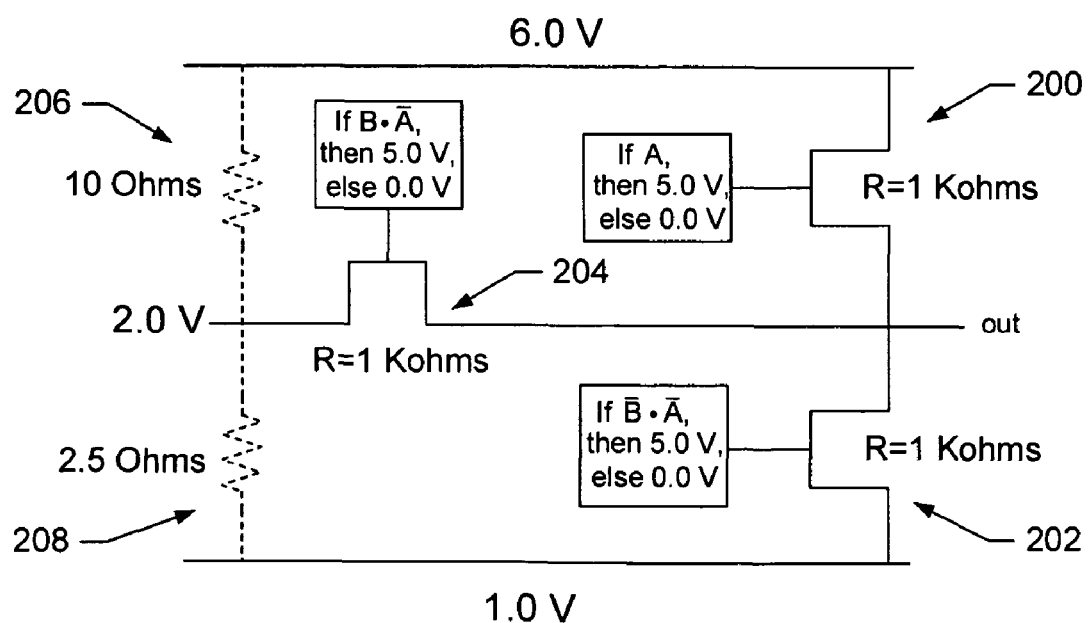
FIG. 20 is a circuit diagram for illustrating the analysis of a circuit that contains more than two voltage sources.

Referring to FIG. 20, this example illustrates the analysis of a circuit that contains more than two voltage sources. Transistors 200 and 202 are connected in series between a high-side voltage of 6.0V and a low-side voltage of 1.0V. The common point between transistors 200 and 202, which is also the output node, is connected through a transistor 204 to a third voltage source of 2.0V. The voltages at the gates of the transistors are represented by the following symbolic expressions:

Transistor 200: If A, then 5.0V, else 0.0V
Transistor 204: If B·$\overline{A}$, then 5.0V, else 0.0V
Transistor 202: If $\overline{B}$·$\overline{A}$, then 5.0V, else 0.0V First, the program keeps track of the maximum and minimum voltages that are attached to the channel-connected region (CCR) that includes the channels of the transistors 200, 204 and 202. See box 354 in FIG. 3D. In this case the maximum voltage is 6.0V and the minimum voltage is 1.0V.

To evaluate the voltage at the output node, the program visits each of the transistors 200, 204 and 202.

It is apparent that transistor 200 is connected to a supply voltage of 6.0V, which is the maximum voltage. Therefore, this voltage supply is treated as Vdd, returning a pull-up resistance of 0 and a pull-down resistance of ∞, yielding the tuple $\{0,\infty,0,0\}$. Putting transistor 200 in series with this gives the tuple {"if A then 1000Ω, else ∞",∞,0,0}, assuming that transistor 200 is fully on when its gate voltage is 5.0V.

Transistor 204 is connected to the intermediate supply voltage 2.0V. To create this supply voltage a phantom voltage divider is established. In this embodiment, the pull-up transistor 206 is set at 10 ohms, and the appropriate value of the pull-down transistor 208 is determined by the formula:

Intermediate voltage=$V$min+($V$max−$V$min)*($D$/($U$+$D$))

2V=1V+(6V−1V)*($D$/(10Ω+$D$))

D=2.5Ω

Using the formulas set forth above, the pull-up resistance in the overlapping path from the output node through transistor 204 and transistor 206 is:

$U$=$R$206+$R$204(1+($R$206/$R$208))=5010Ω and the pull-down resistance in the path from the output node through transistor 204 and transistor 208 is:

$D$=$R$208+$R$204(1+($R$208/$R$206))=1252.5Ω

Taking into account the function at the gate of transistor 204 returns the tuple {"if B·$\overline{A}$ then 5010Ω, else ∞","if B·$\overline{A}$ then 1252.5Ω, else ∞",0,0}. This is put in parallel with transistor 200 to yield {"if A then 1000Ω, else if B then 5010Ω, else ∞","if A then ∞, else if B then 1252.5Ω, else ∞",0,0}.

transistor 202 is connected to a supply voltage of 1.0V, which is the minimum voltage. Therefore, this voltage supply is treated as Gnd, returning a pull-up resistance of ∞ and a pull-down resistance of 0, yielding the tuple {∞,0,0,0}. Putting transistor 202 in series with this gives the tuple {∞,"if $\overline{B}$·$\overline{A}$ then 1000Ω, else ∞", ∞,0,0}, assuming that transistor 202 is fully on when its gate voltage is 5.0V. The path through transistor 202 is then put in parallel with the paths through transistors 204 and 200 to return the tuple {"if A then 1000Ω, else if B then 5010V, else ∞","if A then ∞, else if B then 1252.5Ω, else 1000Ω",0,0}.

To compute the new value of the output node, the program first computes the normalized output voltage:

$V$norm=$D$/($U$+$D$)="If $A$ then 1.0, else if $B$ then 0.2, else 0.0"

The actual voltage at the output node is then computed using the formula:

$V$=$G$nd+$V$norm*($V$dd+$G$nd)="If $A$ then 6.0V, else if $B$ then 2.0V, else 1.0V"

This is what is expected, since the on conditions of transistors 200, 204 and 202 are mutually exclusive and thus the output voltage is selected from the three input voltages of 6.0V, 2.0V and 1.0V.

EXAMPLE 3

Figure 18:
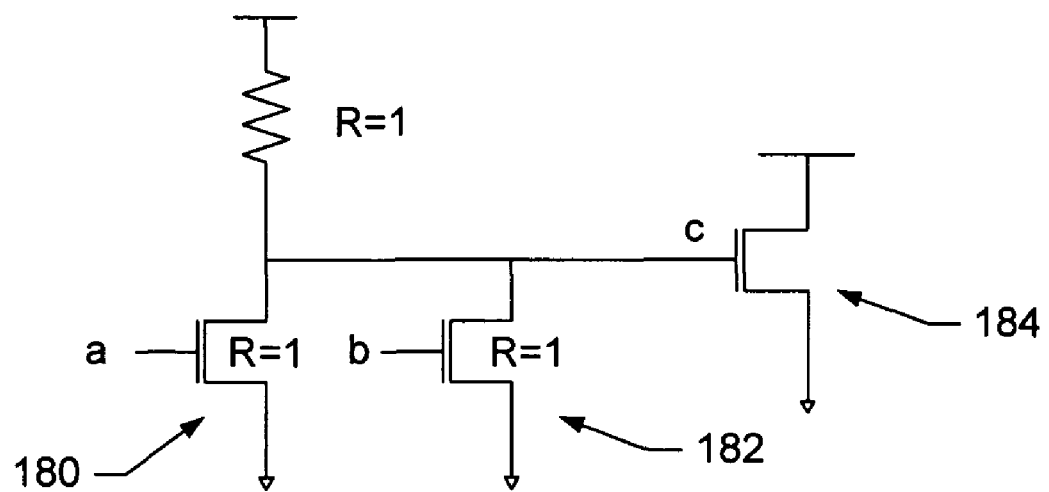

In the circuit shown in FIG. 18, assume that input a is unknown and input b is a 1. Thus the resistance of transistor 180 is either 1 ohm or infinity and the resistance of transistor 182 is 1 ohm. The pull-down resistance of node c is in the range between 1 ohm (if a is zero) and 0.5 ohm (if a is 1).Thus, for node c:

Dmax=1 ohm

Dmin=0.5 ohm

Umax=Umin=1

With these values of Dmax, Dmin, Umax, and Umin, the voltage at node c can be expressed as a range between 0.5 (Vdd-Gnd) and 0.33 (Vdd-Gnd).

$$V\max = D\max/(D\max + U\min)*(Vdd - Gnd)$$
$$= 1/(1+1)/(Vdd - Gnd)$$
$$= 0.5(Vdd - Gnd)$$
$$V\min = D\min/(D\min + U\max)*(Vdd - Gnd)$$
$$= 0.5/(0.5+1)(Vdd - Gnd)$$
$$= 0.33(Vdd - Gnd)$$

As indicated in box 352 in FIG. 3C, the data set for each node is able to store a range of voltages at the node.

Thus the channel resistance of transistor 184 would be determined by using a piece-wise linear lookup table and assuming that the gate voltage is between 0.33(Vdd-Gnd) and 0.5(Vdd-Gnd).

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

The invention claimed is:

1. A method of simulating a circuit containing an analog component, the method being performed in a computer, the method comprising:
    creating an RC tree representing a group of transistors in the analog component, each of the transistors being represented as a variable resistance in the RC tree;
    creating a piece-wise linear lookup table for a transistor in the group of transistors, the piece-wise linear lookup table containing a set of gate-to-source voltages and a factor corresponding to each gate-to-source voltage within the set, the factor being representative of a channel resistance of the transistor at the corresponding gate-to-source voltage;
    determining an operative gate-to-source voltage of the transistor as a first symbolic expression comprising a plurality of real-valued input voltages corresponding to a plurality of logical conditions;
    using the piece-wise linear lookup table to determine the channel resistance of the transistor at the operative gate-to-source voltage, as a second symbolic expression comprising a plurality of resistances corresponding to the plurality of logical conditions, each resistance being obtained by applying a corresponding real-valued input voltage in the first symbolic expression to said table;
    using the second symbolic expression to compute a voltage at a node of the analog component, the voltage being represented symbolically as a third symbolic expression comprising the plurality of logical conditions and a plurality of real-valued output voltages, each real-valued output voltage being computed based on the second expression and based at least partially on a supply voltage and a ground voltage of the analog component; and
    storing said third symbolic expression in a memory of said computer.

2. The method of claim 1 wherein using the piece-wise linear lookup table to determine the channel resistance of the transistor comprises interpolating between two of the factors in the piece-wise linear lookup table.

3. The method of claim 1 wherein using the piece-wise linear lookup table to determine the channel resistance of the transistor comprises extrapolating from one of the factors in the piece-wise linear lookup table.

4. The method of claim 1 wherein the factor is a channel sheet resistance of the transistor.

5. The method of claim 4 wherein using the piece-wise linear lookup table to determine the channel resistance of the transistor comprises multiplying the channel sheet resistance corresponding to the gate-to-source voltage in the piece-wise linear lookup table by the channel length of the transistor and dividing the product of such multiplication by the channel width of the transistor.

6. The method of claim 4 wherein using the piece-wise linear lookup table to determine the channel resistance of the transistor comprises:
    selecting a first gate-to-source voltage and a second gate-to-source voltage from the set of gate-to-source voltages in the piece-wise linear lookup table;
    identifying a first channel sheet resistance corresponding to the first gate-to-source voltage and a second channel resistance corresponding to the second gate-to-source voltage in the piece-wise linear lookup table;
    using the operative gate-to-source voltage, interpolating between the first and second channel sheet resistances to determine an actual channel sheet resistance; and
    multiplying the actual channel sheet resistance by the channel length of the transistor and dividing the product of such multiplication by the channel width of the transistor.

7. The method of claim 1 wherein using the piece-wise linear lookup table to determine the channel resistance of the transistor comprises:
    selecting a gate-to-source voltage from the set of gate-to-source voltages in the piece-wise linear lookup table;
    identifying a channel sheet resistance corresponding to the gate-to-source voltage in the piece-wise linear lookup table;
    using the operative gate-to-source voltage, extrapolating from the channel sheet resistance to determine an actual channel sheet resistance; and
    multiplying the actual channel sheet resistance by the channel length of the transistor and dividing the product of such multiplication by the channel width of the transistor.

8. The method of claim 1 comprising creating a piece-wise linear lookup table for each transistor in the RC tree.

9. The method of claim 1 wherein the RC tree comprises at least one channel-connected region (CCR).

10. The method of claim 9 wherein determining the operative gate-to-source voltage comprises computing the difference between a gate voltage of an N-channel transistor and a lowest voltage in the CCR.

11. The method of claim 9 wherein determining the operative gate-to-source voltage comprises computing the difference between a gate voltage of a P-channel transistor and a highest voltage in the CCR.

12. The method of claim 1 wherein the operative gate-to-source voltage is expressed as a multi-terminal binary decision diagram (MTBDD).

13. The method of claim 1 wherein the channel resistance of the transistor is expressed as a multi-terminal binary decision diagram (MTBDD).

14. The method of claim 1 wherein the voltage of said node of the analog component is expressed as a multi-terminal binary decision diagram (MTBDD).

15. The method of claim 14 wherein a second input terminal of the circuit has an unknown voltage and wherein the voltage of said node of the analog component comprises a range of voltages.

16. The method of claim 14 comprising using an effective capacitance at the analyzed node to compute a delay between a voltage transition at a gate of the transistor and a resulting voltage transition at the analyzed node, the delay being represented symbolically as a Boolean function.

17. The method of claim 16 wherein the delay is expressed as a multi-terminal binary decision diagram (MTBDD).

18. The method of claim 1 wherein the analog component comprises a low voltage source, at least one intermediate voltage source, and a high voltage source, the method comprising creating at least one phantom voltage divider between the low and high voltage sources to represent said at least one intermediate voltage source.

19. The method of claim 18 wherein the phantom voltage divider comprises a pull-up resistor coupled to the high voltage source and a pull-down resistor coupled to the low voltage source and each of the pull-up resistor and the pull-down resistor is smaller than any resistance in said RC tree in the analog component.

20. The method of claim 1 wherein each of said first symbolic expression, said second symbolic expression and said third symbolic expression comprise a common logical condition in the plurality of logical conditions.

21. A computer comprising a memory, said memory comprising:
- a data set, the data set comprising a piece-wise linear lookup table comprising a set of gate-to-source voltages and a set of factors, each of the factors corresponding to one of the gate-to-source voltages, each of the factors representing a channel resistance of a transistor; and
- netlist verification software to program said computer to use a first symbolic representation comprising a plurality of real-valued input voltages representing, under corresponding to a plurality of logical conditions, a voltage at a node of an analog component in a circuit to look up said table and determine therefrom a second symbolic representation of said channel resistance to model the analog component under said plurality of logical conditions.

22. The computer of claim 21 wherein each of the factors is a channel sheet resistance.

23. The computer of claim 21, the data set further comprising:
- an identity of a circuit node associated with a source of the transistor;
- an identity of a circuit node associated with a drain of the transistor;
- an identity of a circuit node associated with a gate of the transistor; and
- an indication whether the transistor is an N-channel transistor or a P-channel transistor.

24. The computer of claim 23 wherein each of the factors is a channel sheet resistance.

25. The computer of claim 21 wherein the first symbolic representation is stored as a part of the data set, the data set further comprising data indicating whether or not the node is located at a voltage source, the capacitance at the node, a list of transistors connected to the node, and a channel-connected region (CCR) in which the node is located.

26. An apparatus comprising a processor and a memory for simulating a circuit containing an analog component, the apparatus comprising:
- means for determining an operative gate-to-source voltage of a transistor in a group of transistors in the analog component, as a first symbolic expression comprising a plurality of real-valued input voltages corresponding to a plurality of logical conditions;
- means for using a piece-wise linear lookup table for said transistor to determine the channel resistance of the transistor at the operative gate-to-source voltage, as a second symbolic expression comprising a plurality of resistances corresponding to the plurality of logical conditions, each resistance being obtained by applying a corresponding real-valued input voltage in the first symbolic expression to said table;
- means for using the second symbolic expression to compute a voltage at a node of the analog component, the voltage being represented symbolically as a third symbolic expression comprising the plurality of logical conditions and a plurality of real-valued output voltages, each real-valued output voltage being computed based on the second expression and based at least partially on a supply voltage and a ground voltage of the analog component.

27. The apparatus of claim 26 wherein the analog component comprises a low voltage source, at least one intermediate voltage source, and a high voltage source, the apparatus further comprising means for creating at least one phantom voltage divider between the low and high voltage sources to represent said at least one intermediate voltage source.

28. The apparatus of claim 26 wherein each of said first symbolic expression, said second symbolic expression and said third symbolic expression comprise a common logical condition in the plurality of logical conditions.

* * * * *